(12) United States Patent
Yajima et al.

(10) Patent No.: US 6,800,539 B2
(45) Date of Patent: Oct. 5, 2004

(54) THIN FILM FORMATION METHOD

(75) Inventors: Takahiro Yajima, Kyoto (JP); Masahiro Kanai, Tokyo (JP); Shuichiro Sugiyama, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/900,043

(22) Filed: Jul. 9, 2001

(65) Prior Publication Data

US 2002/0039832 A1 Apr. 4, 2002

(30) Foreign Application Priority Data

Jul. 11, 2000 (JP) ........................................ 2000-209158

(51) Int. Cl.[7] .......................... H01L 21/20; H01L 21/36
(52) U.S. Cl. ........................ 438/485; 438/482; 438/487; 438/488
(58) Field of Search ................................ 438/482, 485, 438/487, 488; 145/DIG. 1

(56) References Cited

U.S. PATENT DOCUMENTS

| | | | |
|---|---|---|---|
| 5,192,717 A | 3/1993 | Kawakami et al. | 439/233 |
| 5,468,521 A | 11/1995 | Kanai et al. | 427/575 |
| 5,575,855 A | 11/1996 | Kanai et al. | 118/718 |
| 5,589,007 A | 12/1996 | Fujioka et al. | 136/249 |
| 5,927,994 A | 7/1999 | Kohda et al. | 438/478 |
| 5,942,049 A * | 8/1999 | Li et al. | 136/258 |
| 6,025,039 A | 2/2000 | Yajima | 427/573 |
| 6,031,198 A | 2/2000 | Moriyama et al. | 219/121.57 |
| 6,159,300 A | 12/2000 | Hori et al. | 118/718 |
| 6,271,055 B1 | 8/2001 | Yajima et al. | 438/97 |
| 6,273,955 B1 | 8/2001 | Yoshino et al. | 118/718 |

FOREIGN PATENT DOCUMENTS

| | | | |
|---|---|---|---|
| EP | 03085249 | | 4/1991 |
| EP | 562623 | * | 9/1993 |
| EP | 0658918 A2 | | 12/1994 |
| EP | 1032054 | * | 8/2000 |
| EP | 01 11 6824 | | 12/2001 |
| JP | 5-56850 | | 8/1991 |
| JP | EP 658198 | * | 12/1994 ............ H01J/37/32 |
| JP | EP 658918 A2 | * | 12/1994 ............ H01J/37/32 |
| JP | 7-105354 | | 11/1995 |
| JP | 2730693 | | 3/1998 |
| WO | WO 00/32841 | * | 6/2000 |

* cited by examiner

Primary Examiner—George Fourson
Assistant Examiner—Julio J. Maldonado
(74) Attorney, Agent, or Firm—Fitzpatrick, Cella, Harper & Scinto

(57) ABSTRACT

In a discharge space, a substrate 201 and a cathode 206 are disposed a distance d (cm) apart from each other, and gas containing one or more silicon compounds and hydrogen are introduced into the discharge space, and a product Pd of a film forming pressure P (Pa) and d, and a hydrogen flow rate M (SLM) are set so as to meet a relation: $80M+200 \leq Pd \leq 160M+333$, and an RF power is applied to generate a plasma and a non-monocrystal silicon thin film is formed on the substrate 201 in the discharge space. Thereby, there is provided a thin film formation method making it possible to form an amorphous silicon film in which both a uniform film forming rate of a film distribution facilitating an implementation of a large area and a high conversion efficiency can be obtained while achieving an increase in the film forming rate.

5 Claims, 7 Drawing Sheets

THIN FILM FORMATION METHOD

BACKGROUND OF THE INVENTION

1. Field of the Invention

The present invention relates to a thin film formation method for forming a non-monocrystal silicon thin film on a substrate in a discharge space.

2. Related Background Art

Capable of implementing a thin film and a large area and composing in a great degree of freedom and controllable for electric and optical characteristics in a wide range, an amorphous semiconductor, e.g. amorphous silicon, attracts an attention recently as materials of various devices, and in particular, amorphous silicon attracts an attention as solar cell materials because of being characterized in that an absorption coefficient near a peak of an energy distribution in solar rays is greater than that of crystalline silicon, its forming temperature is low and a film can be formed directly on a substrate from a source gas by glow discharge.

In solar cells thought highly of as one circle of future new energy measures, the implementation of a lower price and a higher function provides a current significant problem of study and development. Also in the amorphous silicon, those of a considerably high conversion efficiency have become obtainable as solar cell materials, but implementation of a lower price is still insufficient and technical problems such as a larger area or improved film forming rate remain unsolved for mass production.

For the amorphous silicon, generally, generating a plasma by making an RF discharge between a substrate or an electrode supporting the substrate and another electrode and decomposing a source gas mixture of gases containing a silicon compound such as $SiH_4$, hydrogen gas and impurity gases on action of the plasma results in its film formation on the substrate. Several factors can be referred of affecting the film forming rate of amorphous silicon and especially, include a C-S (Cathode-Substrate) distance, a used gas mixture, a pressure and flow rate of the gas introduced into a discharge space, further a substrate temperature and a power and frequency of RF discharge.

As a method for improving the film forming rate of amorphous silicon, contracting the C-S distance is disclosed in Japanese Patent Application Laid-Open No. 5-56850. Besides, Japanese Patent No. 2730693 discloses that contraction of the C-S distance, mixing of He and control of the gas flow rate enables discharge in an atmospheric pressure, thus implementing a high film forming rate. Alternatively, in Japanese Patent Publication No. 7-105354, it is disclosed that the frequency of RF power is changed from 13.56 MHz, frequently used formerly, to a range of 25 to 150 MHz to adopt a VHF discharge and a relation between the C-S distance d and the frequency f is set to 30 MHz/cm$\leq$f/d$\leq$10 MHz/cm, thereby enabling a high film forming rate to be obtained.

Only by contracting the C-S distance in forming an amorphous silicon film with the frequency of RF power set to 13.56 MHz, the film forming rate increased, but discharge was instabilized or the irregularity in film forming rate was large though discharge occurs and accordingly a locally thick film was formed. A certain number of such problems remained unsolved to increase the area of an amorphous silicon film. Besides, even if the film forming rate was slightly irregular and a uniform film was formed, a high conversion efficiency is not always obtained surely as solar cell materials.

SUMMARY OF THE INVENTION

In consideration of the above circumstances, it is an object of the present invention to provide a method for forming an amorphous silicon thin film easy to making a larger area in which a uniform film forming rate and a high conversion efficiency is obtained.

The present invention made to attain the above object is constructed as follows.

That is, a thin film formation method according to the present invention is characterized by employing a surface of a substrate as one electrode and disposing the surface of the substrate in a distance d (cm) apart from another electrode in a discharge space in which there are positioned at least a pair of electrodes connected to an RF power source, and introducing both a gas containing one or more silicon compounds and hydrogen into the above discharge chamber, setting the product Pd of a film forming pressure P (Pa) and d and hydrogen flow rate M (SLM: flow rate (dm$^3$) per min at the standard state) so as to meet the relation:

$$80M+200 \leq Pd \leq 160M+333$$

and applying RF power to generate a plasma and to form a non-monocrystal silicon thin film on the substrate in the discharge space.

In such a thin film formation method according to the present invention, the above product Pd and the flow rate L (SLM) of a gas mixture comprising the gas containing one or more silicon compounds and hydrogen are preferably set so as to meet the relation:

$$67L+200 \leq Pd \leq 147L+333.$$

Furthermore, a thin film formation method according to the present invention is characterized by employing a surface of a substrate as one electrode and disposing the surface of the substrate in a distance d (cm) apart from another electrode in a discharge space in which there are positioned at least a pair of electrodes connected to an RF power source, and introducing both a gas containing one or more silicon compounds and hydrogen into the above discharge chamber, setting the product Pd of a film forming pressure P (Pa) and d and the ratio M/V of hydrogen flow rate M (SLM) to volume V (cm$^3$) of the above discharge space so as to meet the relation:

$$4\times10^5 dM/V+200 \leq Pd \leq 8\times10^5 dM/V+333$$

and applying RF power to generate a plasma and to form a non-monocrystal silicon thin film on the substrate in the discharge space.

In such a thin film formation method according to the present invention, the above product Pd and the ratio L/V of flow rate L (SLM) of a gas mixture comprising a gas containing one or more silicon compounds and hydrogen to volume V (cm$^3$) of the above discharge space are preferably set so as to meet the relation:

$$3.3\times10^5 dL/V+200 \leq Pd \leq 7.3\times10^5 dL/V+333.$$

Besides, in these thin film formation methods according to the present invention, the above distance d lies preferably within a range of 0.5 to 3 cm.

DETAILED DESCRIPTION OF THE PREFERRED EMBODIMENTS

Figure 1:
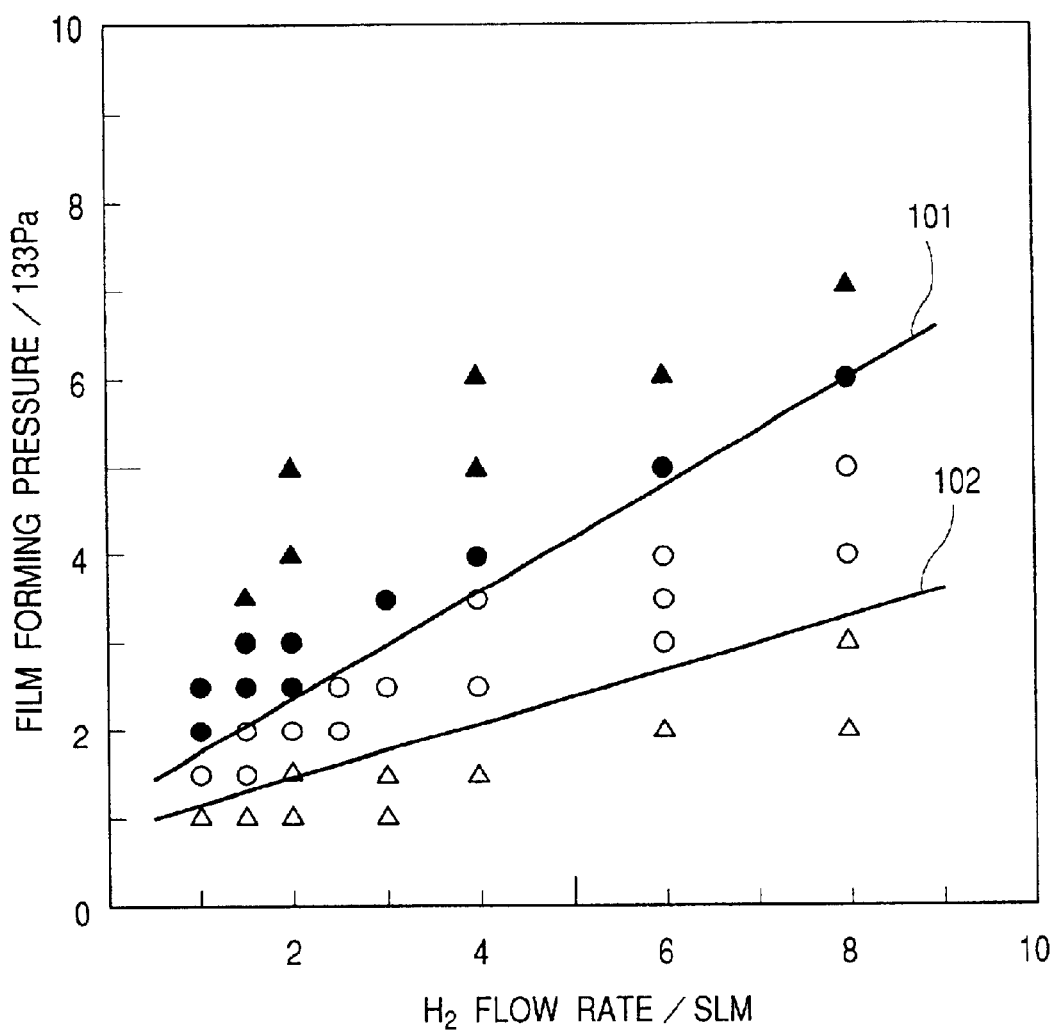
FIG. 1 is a graph showing an experimental result obtained in Embodiment 1.

Referring to the drawings, embodiments of the present invention will be described below.

Figure 2:
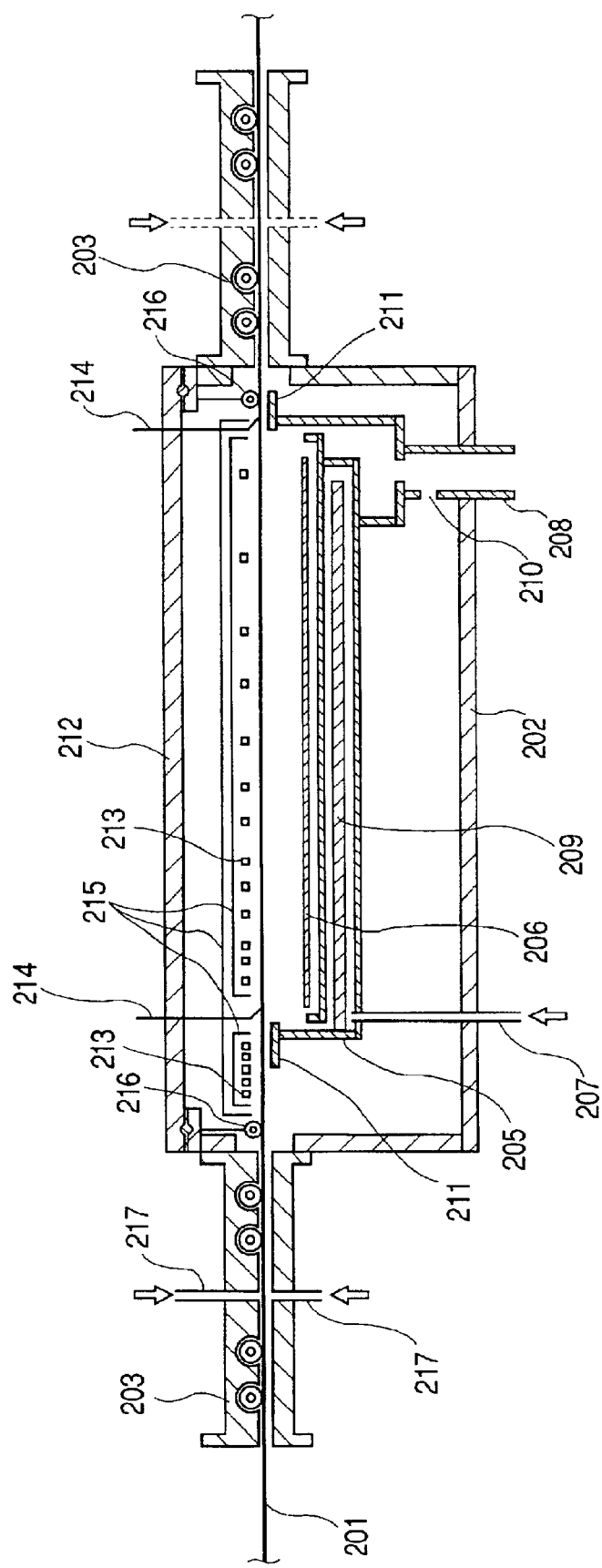
FIG. 2 is a sectional view schematically showing one example of a thin film forming apparatus for implementing a thin film formation method according to the present invention.

One configuration of parallel planar plate capacity coupling type thin film forming apparatus for implementing a thin film formation method according to the present invention is shown in FIG. 2.

In the apparatus of FIG. 2, a substrate 201 and an electrode 206 are opposed to each other and RF power of 13.56 MHz can be applied to the above electrode to generate an RF plasma and to decompose a source gas, thus permitting an amorphous silicon thin film to be deposited on a substrate. The apparatus of FIG. 2 also has a vacuum vessel lid 212, heat-reflecting plates 215, magnet rollers 216 and gate gas-introducing pipes 217.

The source gas including a mixture of a silicon-containing compound gas, hydrogen and such others is introduced from an unillustrated gas supply source through a source gas introducing pipe 207 penetrating the wall of a vacuum vessel 202 into a discharge chamber 205 and heated by means of a block heater 209. After flowing in parallel to the substrate 201 and on the electrode 206 of the discharge chamber 205 with an exhaust pipe 208 for the source gas exhaust provided in the discharge chamber 205, the source gas is exhausted via the exhaust pipe 208 to outside the discharge chamber 205 and further to outside the vacuum vessel. The film forming pressure signifies a pressure inside the discharge chamber at a state of supplying the source gas into the discharge chamber.

As mentioned above, raising the frequency of RF power can be expected to increase the film forming rate still more, but if use of a generally popular RF power source (13.56 MHz) increases the film forming rate and provides a large area and high efficiency amorphous silicon thin film, the apparatus cost can be saved, in which an object of the present invention lies.

By shortening the C-S distance, the film forming rate of an amorphous silicon film is increased, but in case of forming an amorphous silicon film under optimized film forming conditions at a large C-S distance, no high conversion efficiency was obtained even if this film is used as an i-layer serving for the photovoltaic layer of a solar cell. Generally, to obtain a high quality amorphous silicon, a diluent gas of hydrogen or the like is mixed in addition to a source gas containing silicon and a great amount of source gas is allowed to flow. However, when the C-S distance is contracted, the sectional area relative to the flow of the gas in a discharge chamber decreases and with increasing gas flow rate, the flow velocity of the source gas markedly increases. For this reason, the source gas is considered to be exhausted without fully decomposed by a plasma.

If the source gas is not fully decomposed to form an amorphous silicon film, this film becomes an i-layer abundantly containing non-bonding fingers or defects and no high efficiency is considered to be obtained. Alternatively, a compound gas containing silicon compounds such as $SiH_4$ is relatively easy to decompose, but since hydrogen or the like as a diluent gas needs a considerable time for the decomposition, the flow velocity becomes too fast and therefore the generation ratio of hydrogen radicals, hydrogen ions and such like are considered to decrease. Generally, in amorphous silicon, the arrival of hydrogen radicals or hydrogen ions to its growth surface alleviates the structure and thus a high quality semiconductor thin film is considered to be formed. For this reason, if the flow rate is accelerated and hydrogen radicals or hydrogen ions are generated in a small amount, a high quality formed film of amorphous silicon becomes unexpectable.

Thus, considering an increase in flow velocity occurring by contracting the C-S distance, the inventors of the present invention optimized the film forming conditions again while shortening the C-S distance and groped for conditions of obtaining an even film forming rate distribution enabling a larger area and conditions of obtaining a high quality amorphous silicon film and as a result, found a relation of the C-S distance d and the film forming pressure P to the hydrogen flow rate M or the flow rate L of a gas mixture comprising a gas containing a silicon compound and hydrogen, thus leading to the present invention.

To increase the film forming rate of an amorphous silicon film, it is desired that the C-S distance d is 5 cm or shorter. It is still well preferable that the C-S distance d is 3 cm or shorter, but since a shorter C-S distance than 0.5 cm leads to difficulty in the occurrence of discharge, a range of 0.5 to 3 cm is really desired.

As a gas containing a silicon compound, $SiH_4$, $Si_2H_6$ or the like is preferably used. Besides, as a diluent gas, $H_2$ is used. Furthermore, as one example of compound contained B, P or the like which act as impurities, $B_2H_6$, $BF_3$ or $PH_3$ is preferably used to control valence electrons of amorphous silicon.

As the flow rate of a source gas, a range of 10 to 1000 sccm for a gas containing a silicon compound and a range of 500 to 10000 sccm for $H_2$ (here, sccm represents a flow rate ($cm^3$) per min at the standard state) are desired in view of the mass production of a solar cell. Relative to the volume of a discharge chamber, this corresponds to a range of $1\times10^{-3}$–0.1 sccm for a gas containing a silicon compound and a range of 0.05 to 1 sccm for $H_2$.

As the film forming pressure, generally, the order of 67 to 133 Pa is used by preference, but the inventors made experiment with a still higher range also put into view. As a result, they found that when contracting the C-S distance a higher pressure was desired to promote the discharge stability and a range of 267 to 1333 Pa was preferred.

As the RF power, a range of 100 to 1000 W is preferred and the inventors made film forming experiments in a range of 0.02 to 0.2 $W/cm^2$. As a result, a more uniform film forming rate distribution was obtained at a lower RF power, whereas in case of use for an i-layer, no high conversion efficiency was obtained, but a higher RF power causes a large irregularity in the film forming efficiency though bringing a higher conversion efficiency in case of use for an i-layer and provides a more difficult conditions in forming an amorphous silicon film of a uniform large area.

The amorphous silicon obtained here can be said to be in an amorphous state of a silicon-based material and may partly contain so-called microcrystalline silicon.

Next, embodiments of the present invention will be described, but the present invention is not limited to these embodiments at all.

Embodiment 1

This embodiment is an example of using a thin film forming apparatus as shown in FIG. 2 to form an amorphous silicon thin film on a stainless steel (hereinafter also referred to as "SUS") band-shaped substrate. First, this thin film forming apparatus will be described.

The film forming apparatus chiefly comprises a parallelpiped vacuum vessel 202 coupled with another adjacent vacuum vessel (unillustrated) via a gas gate 203, a discharge chamber 205 provided inside the vacuum vessel 202 and a band-shaped substrate 201 penetrating the gas gate 203 to be introduced into the discharge chamber 205. A plurality of these film forming apparatuses are placed side by side and linked by using gas gates, a band-shaped substrate 201 is made to penetrate through the film forming apparatuses and an n-type layer, an i-type layer and a p-type layer are continuously formed. Incidentally, in case of examining the film forming rate distribution of the i-type layer, an amorphous silicon film of the i-type layer was formed in a fixed time without forming the n-type layer nor the p-type layer and with the band-shaped substrate 201 kept at a standstill.

The discharge chamber 205 provided inside the vacuum vessel 202 is shaped into a hollow parallel-piped with one surface thereof forming an opening and the opening is provided close to the band-shaped substrate 201. After introduced into the discharge chamber 205, the band-shaped substrate 201 is heated by means of a lamp heater 213 and regulated in temperature by using a thermocouple 214.

In the discharge chamber, parallel flat plate-shaped electrodes 206 are provided, to which power can be applied from an illustrated RF power source to a plasma in the discharge chamber.

From an unillustrated gas supply source, a source gas is introduced through a source gas introducing pipe 207 penetrating the wall of the vacuum vessel 205 and heated by means of a block heater 209. At the discharge chamber 205, an exhaust pipe 208 for the source gas exhaust is provided. After flowing in parallel to the conveying direction of the band-shaped substrate 201 and flowing on the electrodes 206 of the discharge chamber 205, the source gas is exhausted through the exhaust pipe 208 to outside the discharge chamber and further to outside the vacuum vessel. The gas gate gas in the vacuum vessel and part of the source gas are exhausted from a discharge chamber external exhaust port 210 provided at part of the exhaust pipe 208.

With this embodiment, it is taken as indices to maintain a high film forming rate, to accomplish a large-area and uniform film formation and to obtain a high conversion efficiency as a solar cell and a film forming experiment of an i-type amorphous silicon was made in a rage of the following conditions.

| | |
|---|---|
| Flow rate of SiH$_4$: | 500 sccm |
| Flow rate of H$_2$: | 1000 to 8000 sccm |
| Film forming pressure: | 133 to 933 Pa |
| RF power: | 400 W |
| | (0.08 W/cm$^2$) |

-continued

| | |
|---|---|
| RF frequency: | 13.56 MHz |
| Substrate temperature: | 220° C. |
| Cathode-Substrate distance (C-S distance): | 2 cm |
| Cathode area: | 50 × 100 cm$^2$ |
| Substrate: | SUS (50 cm wide) |

In estimation as a solar cell, after an Ag film and a ZnO film are successively formed in advance on a band-shaped SUS substrate as back face reflective layers in advance, an n-layer is formed on the ZnO layer, further an i-layer is formed on it under the above conditions, thereafter a p-layer is formed on the surface of the i-layer and a substrate is taken out into the atmosphere. The substrate after the film formation is cut out in a size of 5×5 cm$^2$, then a transparent electrode layer (ITO) and a current extract grid electrode were provided and pseudo sunlight (AM 1.5, 100 mW/cm$^2$) was irradiated to measure the conversion efficiency.

The result obtained with the H$_2$ flow rate and film forming pressure taken at the abscissa and ordinate respectively is shown in FIG. 1 by using symbols. In case of forming an amorphous silicon film, a small film forming rate distribution in width becomes an important factor for manufacturing a large-area and uniform solar cell. Thus, in FIG. 1, attention is paid to film forming rate irregularity in width and estimation was made. Mark ▼ signifies that the irregularity of deposition rate of film (hereinafter referred to as "D.R.") in width is too great (maximum D.R. in width is twice the average D.R. or greater) to suit for a large area. Mark ● signifies that the irregularity of film forming rate is relatively near to flatness (maximum D.R. in width is less than double the average D.R. and equal to or greater than 1.5 times) but a little problematic in implementing a large area and Marks ○ and Δ signify that the irregularity of film forming rate is small (maximum D.R. is less than 1.5 times the average D.R.). In particular, Mark ○ signifies that the conversion efficiency is higher than the average for all samples in which the irregularity of film forming rate obtained at a C-S distance of 2 cm is small (maximum D.R. of less than twice the average D.R.) and Mark Δ signifies that the conversion efficiency is lower than the above average.

As shown in FIG. 1, if the film forming pressure is too high, the irregularity of film forming rate tends to increase, which tendency is marked especially for a small H$_2$ flow rate. On the other hand, if the film forming pressure is made lower, the irregularity of film forming rate decreases but the conversion efficiency tends to lower. In the area between the solid lines 101 and 102, amorphous silicon with a small irregularity of film forming rate and a high conversion efficiency was found to be obtained.

Figure 4:
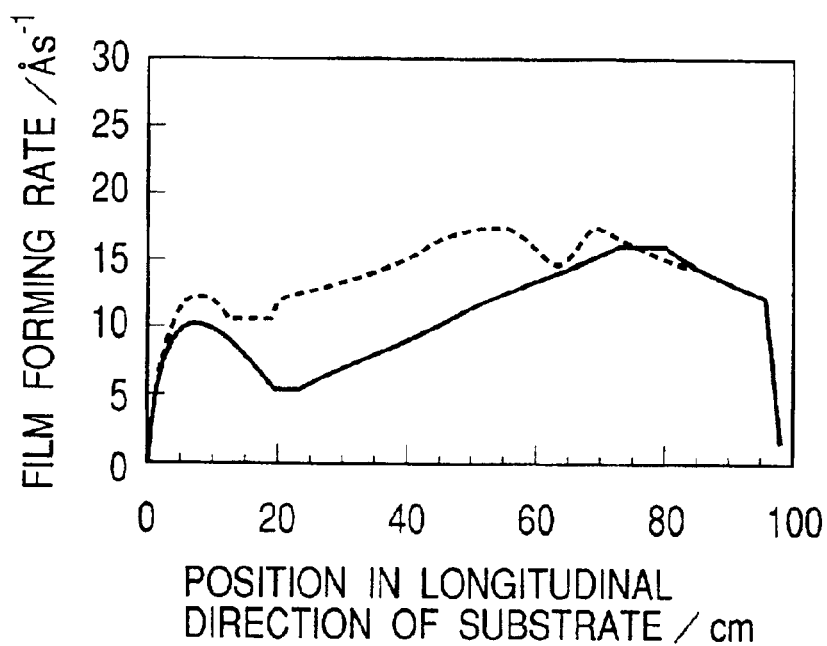
FIG. 4 is a graph showing a film forming rate of an amorphous silicon film obtained in Embodiment 1.

With positions in length of a substrate taken at the abscissa and film forming rate taken at the ordinate, FIG. 4 shows an example of cases where the film forming rate irregularity is abundant. This relates to a film forming rate distribution for a C-S distance of 2 cm, a pressure of 467 Pa and an H$_2$ flow rate of 1500 sccm, where the solid line represents the distribution at the center in width and the dotted line does the one of 5 cm apart from a substrate end in width. In any range of conditions under which the film forming rate irregularity becomes large, a film forming rate distribution as represented by FIG. 4 is shown, a large difference in film forming rate took place in width and in length and this case did not suit the implementation of a large area.

Figure 5:
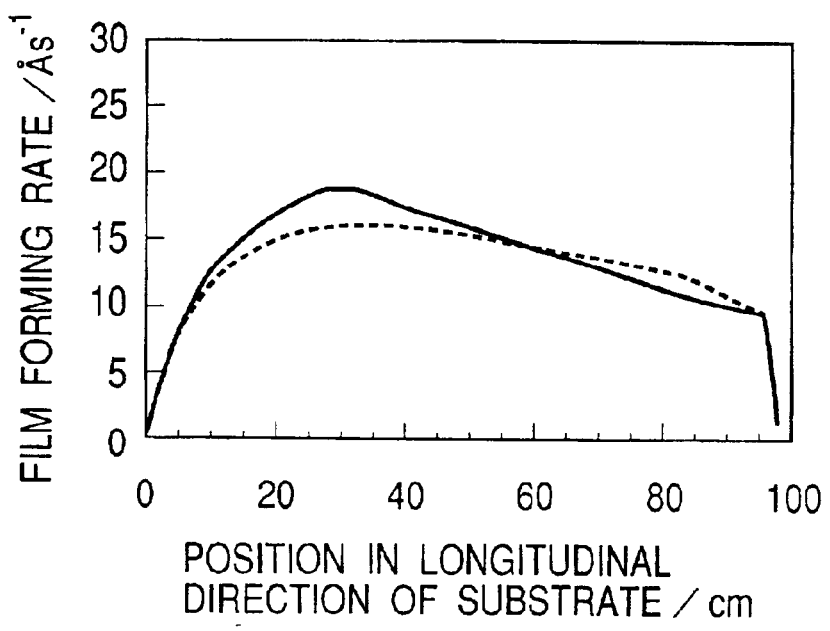
FIG. 5 is a graph showing the film forming rate of an amorphous silicon film obtained in Embodiment 1.

FIG. 5 shows an example of cases where the film forming rate irregularity is scarce. This corresponds to a film forming rate distribution for a C-S distance of 2 cm, a pressure of 533 Pa and an $H_2$ flow rate of 6000 sccm, where the solid line and the dotted line signifies in a similar manner to that of FIG. 4. Besides, in any range of conditions under which the film forming rate irregularity is small, a film forming rate distribution as represented by FIG. 5 is shown, hardly any difference in film forming rate is detected in width and no difference is observed also in length. This is a film forming rate distribution advantageous for the implementation of a large area in an amorphous silicon thin film.

If the C-S distance is greater than 2 cm, the conditions for obtaining a high conversion efficiency are conditions comprising a lower pressure and a greater $H_2$ flow rate than observed in the area enclosed with the solid lines of FIG. 1, which allow the film forming rate irregularity to increase or polysilane powder to be generated in a great amount if a film is formed in the area enclosed with the solid lines of FIG. 1.

Embodiment 2

With the C-S distance set to 1 cm, optimizing the film forming conditions is intended. The experimental method is made similar to that of Embodiment 1 and the following conditions are employed.

| | |
|---|---|
| Flow rate of $SiH_4$: | 500 sccm |
| Flow rate of $H_2$: | 1000 to 8000 sccm |
| Film forming pressure: | 400 to 1200 Pa |
| RF power: | 400 W |
| | (0.08 $W/cm^2$) |
| RF frequency: | 13.56 MHz |
| Substrate temperature: | 220° C. |
| Cathode-Substrate distance (C-S distance): | 1 cm |
| Cathode area: | 50 × 100 $cm^2$ |
| Substrate: | SUS (50 cm wide) |

Figure 3:
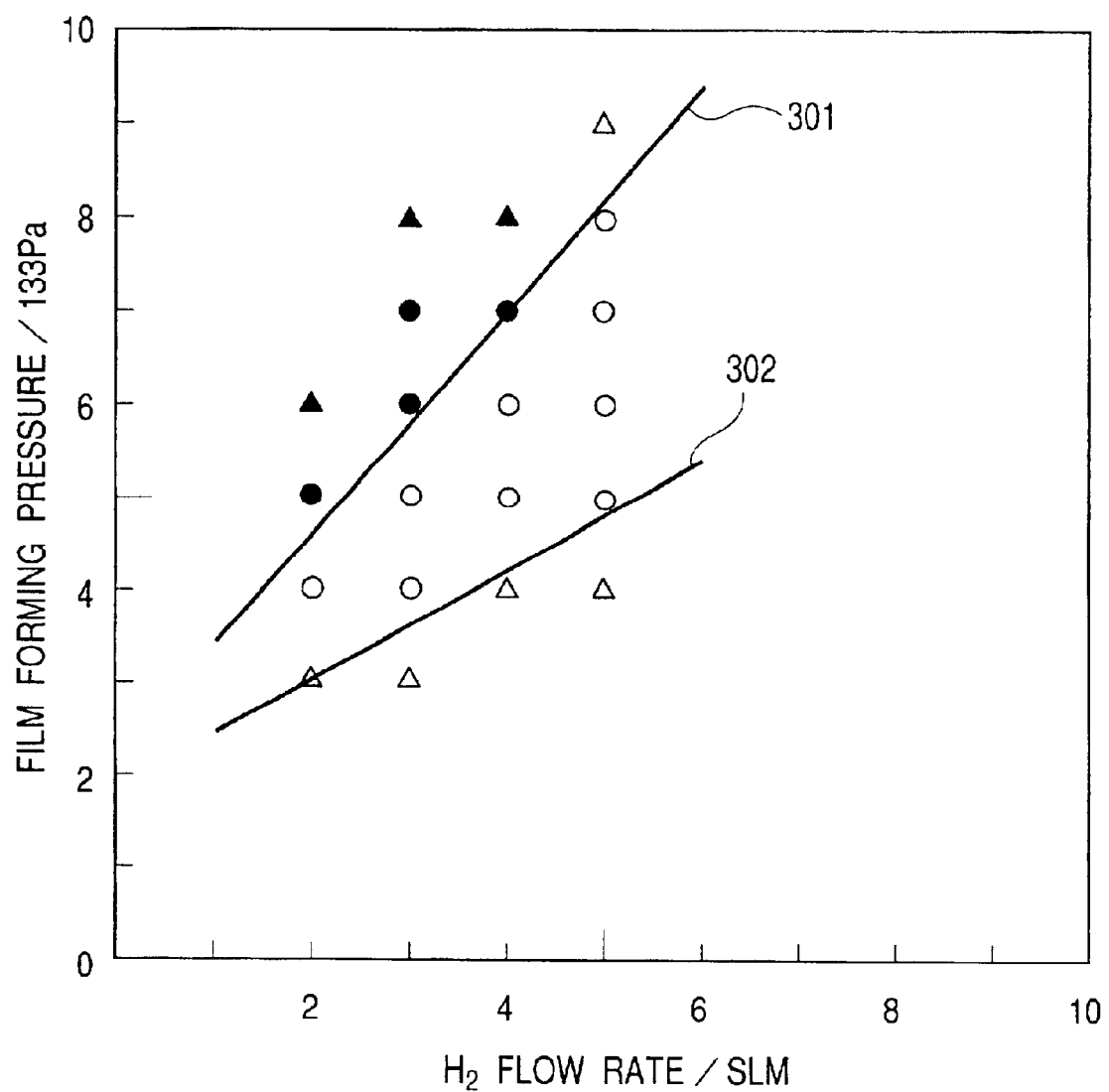
FIG. 3 is a graph showing an experimental result obtained in Embodiment 2.

The result obtained with the $H_2$ flow rate and film forming pressure taken at the abscissa and ordinate respectively is shown in FIG. 3 by using symbols. Also in FIG. 3, the film forming rate distribution in width was estimated as with Embodiment 1. By shortening the C-S distance, the average film forming rate decreased though slightly in comparison with a C-S distance of 2 cm. Mark ▼ signifies that the irregularity of deposition rate of film (hereinafter referred to as "D.R.") in width is too great (maximum D.R. in width is twice the average D.R. or greater) to be suitable for a large area. Mark ● signifies that the irregularity of film forming rate is relatively near to flatness (maximum D.R. in width is less than double the average D.R. and equal to or greater than 1.5 times) but a little problematic in implementing a large area and Marks ○ and Δ signify that the irregularity of film forming rate is small (maximum D.R. is less than 1.5 times the average D.R.). In particular, Mark ○ signifies that the conversion efficiency is higher than the average for all samples in which the irregularity of film forming rate obtained at a C-S distance of 2 cm is small (maximum D.R. of less than twice the average D.R.) and Mark Δ signifies that the conversion efficiency is lower than the above average.

As shown in FIG. 3, if the film forming pressure is too high, the irregularity of film forming rate tends to increase like Embodiment 1. On the other hand, if the film forming pressure is made lower, the irregularity of film forming rate decreases but the conversion efficiency tends to lower. In the area between the solid lines 301 and 302 of FIG. 3, amorphous silicon with a small irregularity of film forming rate and a high conversion efficiency was found to be obtained.

Figure 6:
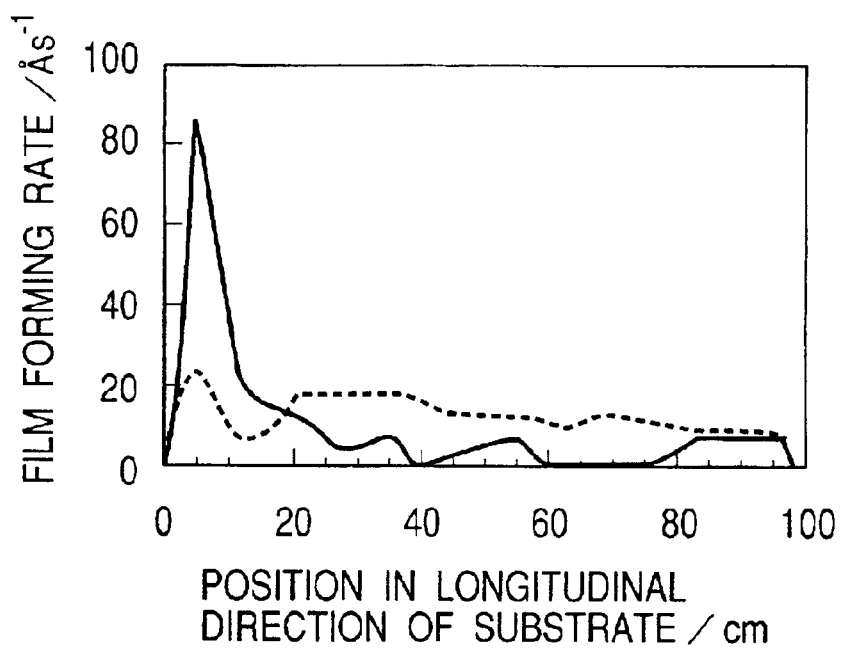
FIG. 6 is a graph showing a film forming rate of an amorphous silicon film obtained in Embodiment 2.

With positions in length of a substrate taken at the abscissa and film forming rate taken at the ordinate, FIG. 6 shows an example of cases where the film forming rate irregularity is abundant. This relates to a film forming rate distribution for a C-S distance of 1 cm, a pressure of 1067 Pa and an $H_2$ flow rate of 3000 sccm, where the solid and dotted lines signify in a similar manner to that of FIG. 4. In any range of conditions under which the film forming rate irregularity becomes large, a film forming rate distribution as represented by FIG. 6 is shown, a large difference in film forming rate took place in width and in length and this case is not suitable for the implementation of a large area.

Figure 7:
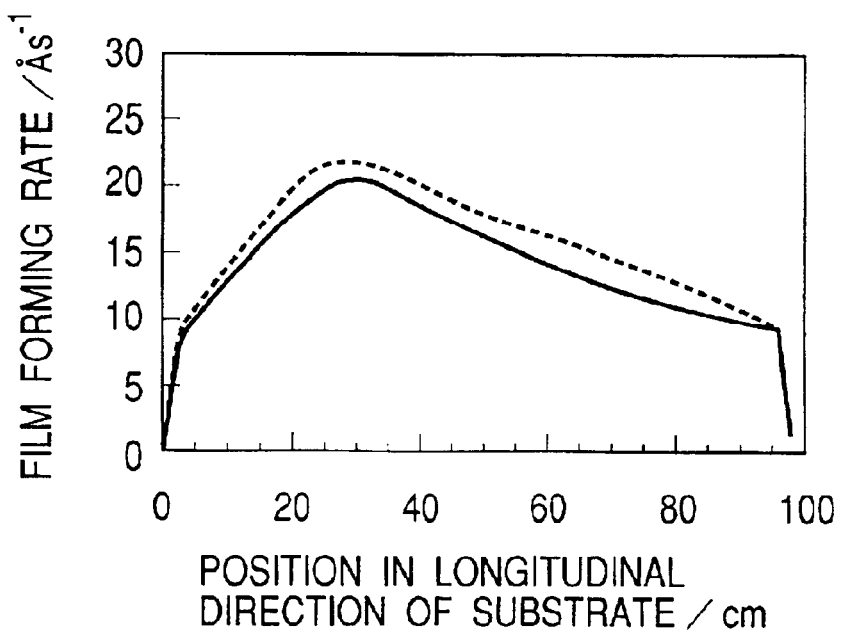
FIG. 7 is a graph showing the film forming rate of an amorphous silicon film obtained in Embodiment 2.

FIG. 7 shows an example of cases where the film forming rate irregularity is scarce. This corresponds to a film forming rate distribution for a C-S distance of 1 cm, a pressure of 667 Pa and an $H_2$ flow rate of 5000 sccm, where the solid line and the dotted line signifies in a similar manner to that of FIG. 4. In any range of conditions under which the film forming rate irregularity is small, as represented by FIG. 7, no great difference in film forming rate is observed in length and an amorphous silicon thin film of a uniform film forming rate especially in width is obtained. This example is advantageous for the implementation of a large area in an amorphous silicon thin film.

As a result of mature consideration in comparison between Embodiments 1 and 2, it was revealed in the area enclosed with the solid lines of FIG. 1 and FIG. 3 permitting an amorphous silicon film of a scarce film forming rate irregularity and a high conversion efficiency to be obtained that the product Pd of the film forming pressure P (Pa) and the C-S distance d and the $H_2$ flow rate M (SLM) are related to each other in the following relation:

$$80M+200 \leq Pd \leq 160M+333.$$

Alternatively, it was revealed that the product Pd and the flow rate L (SLM) of a gas mixture comprising $SiH_4$ and $H_2$ are related to each other in the following relation:

$$67L+200 \leq Pd \leq 147L+333.$$

Furthermore, it was revealed that the product Pd and the ratio M/V of hydrogen flow rate M (SLAM) to volume V ($cm^3$) of the discharge space are related to each other in the following relation:

$$4 \times 10^5 dM/V+200 \leq Pd \leq 8 \times 10^5 dM/V+333.$$

Or else, it was revealed that the product Pd and the ratio L/V of flow rate L (SLM) of a gas mixture comprising $SiH_4$ and $H_2$ to volume V ($cm^3$) of the discharge space are related to each other in the following relation:

$$3.3 \times 10^5 dL/V+200 \leq Pd \leq 7.3 \times 10^5 dL/V+333.$$

At a C-S distance of 2 cm, if the film forming pressure is high (Mark ▼ of FIG. 1), the generation of polysilane powder was detected at cathode ends or the like though the generated amount is small. By setting the C-S distance to 1 cm, the generated amount of polysilane powder decreases sharply even if the film forming pressure is high (Mark ▼ of FIG. 3). By shortening and bringing the C-S distance close to the sheath width of a plasma, it is considered that an area of no slant in plasma potential decreases, the radical polymerization becomes likely to occur and the generation of polysilane powder is suppressed.

Embodiment 3

To confirm the effectiveness of the range of film forming conditions obtained from the results of Embodiments 1 and 2, in this embodiment, an amorphous silicon film was formed at a C-S distance of 2 cm and at a higher RF power as shown below.

When a source gas is decomposed at a high RF power, the film forming rate irregularity increases but the source gas can be fully decomposed, so that a higher conversion efficiency is expectable.

| | |
|---|---|
| Flow rate of SiH$_4$: | 500 sccm |
| Flow rate of H$_2$: | 1000 to 8000 sccm |
| Film forming pressure: | 133 to 1067 Pa |
| RF power: | 900 W |
| | (0.18 W/cm$^2$) |
| RF frequency: | 13.56 MHz |
| Substrate temperature: | 220° C. |
| Cathode-Substrate distance (C-S distance): | 2 cm |
| Cathode area: | 50 × 100 cm$^2$ |
| Substrate: | SUS (50 cm wide) |

Figure 8:
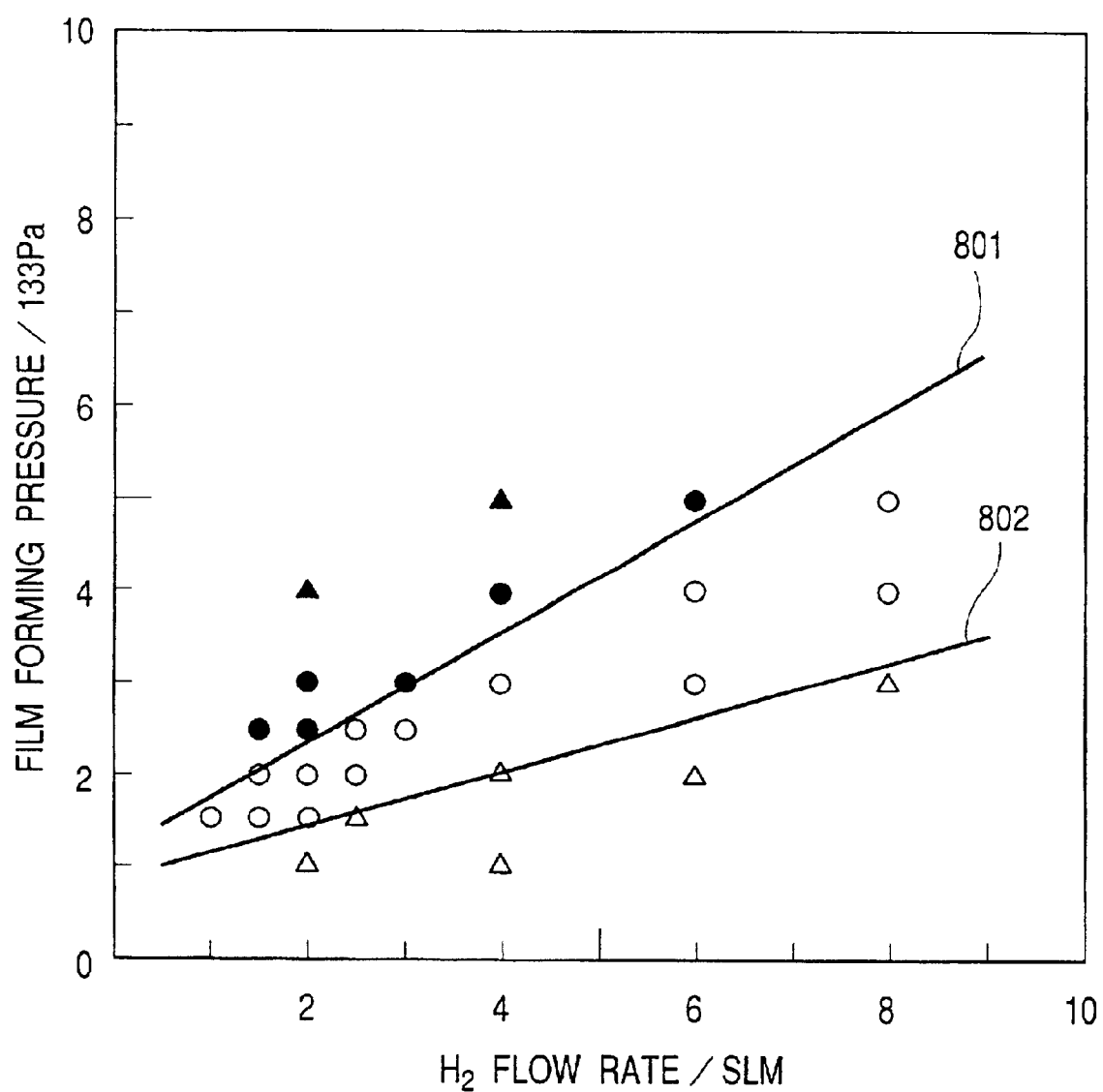
FIG. 8 is a graph showing an experimental result obtained in Embodiment 3.

The result obtained with the H$_2$ flow rate and film forming pressure taken at the abscissa and ordinate respectively is shown in FIG. 8 by using symbols. The meaning of symbols is much the same as with FIG. 1. Like Embodiment 1, if the film forming pressure is too high, the film forming rate irregularity tends to grow. On the other hand, if the film forming pressure is lowered, the film forming rate irregularity decreases but the conversion efficiency tends to fall. In the extent between the solid lines 801 and 802 of FIG. 8, amorphous silicon with a small film forming rate irregularity and a high conversion efficiency was found to be obtained.

Figure 9:
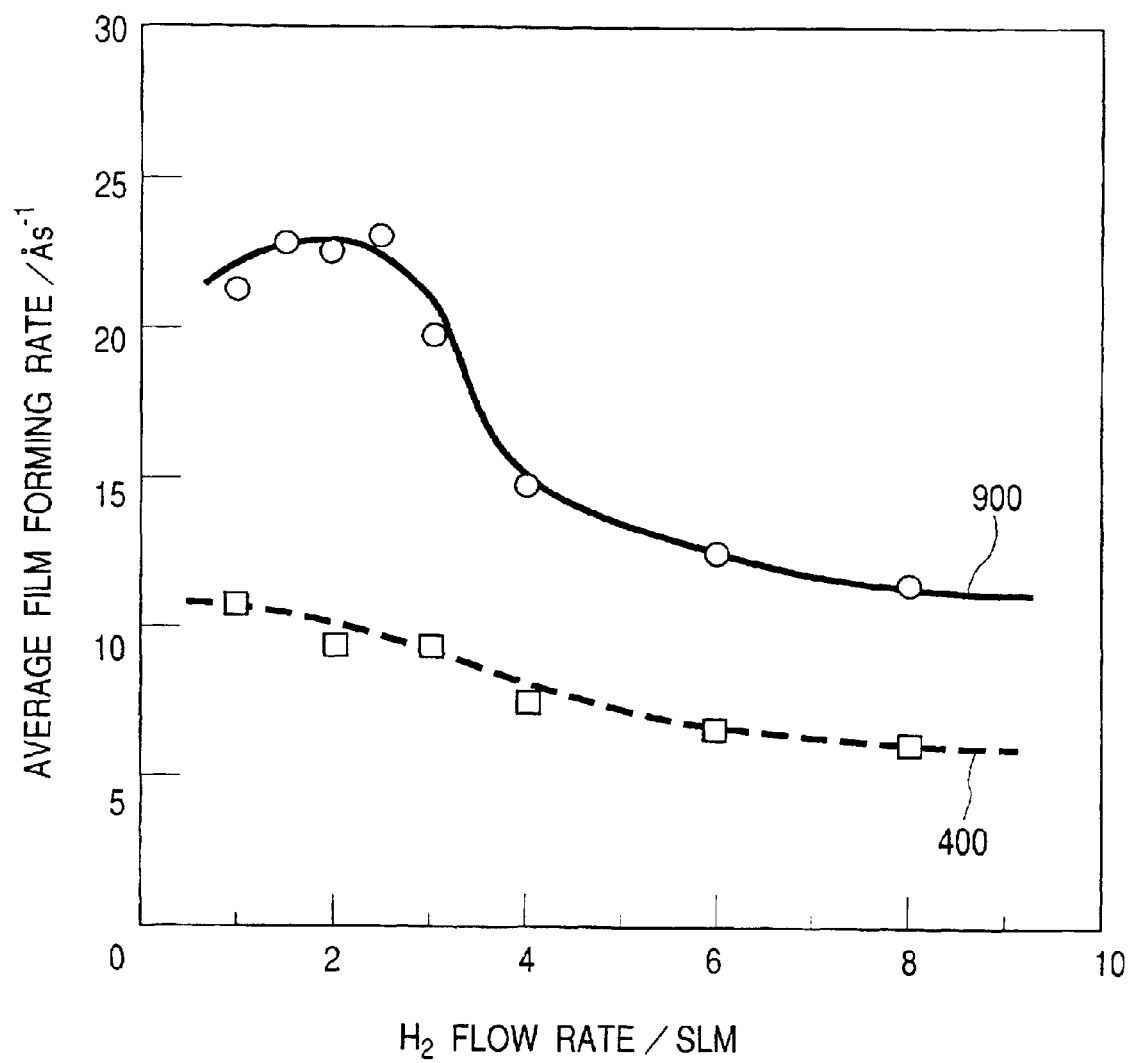
FIG. 9 is a graph showing a relation between an average film forming rate in length of an amorphous silicon film and an $H_2$ flow rate obtained in Embodiments 1 and 3.

Besides, a relation between the average film forming rate and the H$_2$ flow rate for the film formation under film formation conditions of a scarce film forming rate irregularity is shown in FIG. 9. In FIG. 9, Reference Symbol 900 denotes a curve of measured values for an RF power of 900 W and Reference Symbol 400 denotes a curve of measured values for an RF power of 400 W. With increasing the H$_2$ flow rate, the film forming rate tends to decrease. Especially if the H$_2$ flow rate lies in a range of 1 to 4 SLM, a high film forming rate was found to be obtained. With increasing RF power, the average film forming rate increases, but if the H$_2$ flow rate is 1 SLM or lower, polysilane powder came to occur.

By a thin film formation method according to the present invention, the formation was made possible of an amorphous silicon film in which a uniform film forming rate distribution facilitating the implementation of a large area and a high conversion efficiency are obtained while achieving an increase in film forming rate

What is claimed is:

1. A thin film forming method, comprising the steps of:

employing a surface of a substrate as one electrode and disposing the surface of the substrate in a distance d (cm) apart from another electrode in a discharge space in which there are positioned at least a pair of electrodes connected to an RF power source;

introducing a gas containing one or more silicon compounds and hydrogen into the discharge space;

setting the product Pd of a film forming pressure P (Pa) and d and the ratio M/V of hydrogen flow rate M (SLM) to volume V (cm$^3$) of the discharge space so as to meet the relation:

$$4 \times 10^5 dM/V + 200 \leq Pd \leq 8 \times 10^5 dM/V + 333;$$ and applying RF power to generate a plasma and to form a non-monocrystal silicon thin film on the substrate in the discharge space.

2. The thin film forming method as set forth in claim 1, wherein said product Pd and flow rate L (SLM) of a gas mixture comprising said gas containing one or more silicon compounds and hydrogen divided by said volume V (cm$^3$) are set so as to meet the relation:

$$3.3 \times 10^5 dL/V + 200 \leq Pd \leq 7.3 \times 10^5 dL/V + 333.$$

3. The thin film forming method as set forth in claim 1, wherein said distance d lies in a range of 0.5 to 3 cm.

4. The thin film forming method as set forth in claim 1, wherein said hydrogen flow rate M ranges from 500 sccm to 1000 sccm.

5. The thin film forming method as set forth in claim 1, wherein a flow rate of said gas containing one or more of said silicon compounds ranges from 10 sccm to 1000 sccm.

* * * * *

UNITED STATES PATENT AND TRADEMARK OFFICE
CERTIFICATE OF CORRECTION

PATENT NO. : 6,800,539 B2
DATED : October 5, 2004
INVENTOR(S) : Takahiro Yajima et al.

It is certified that error appears in the above-identified patent and that said Letters Patent is hereby corrected as shown below:

Column 6,
Line 27, "Mark ▼" should read -- Mark ▲ --.

Column 7,
Line 42, "Mark ▼" should read -- Mark ▲ --.

Column 8,
Lines 55 and 59, "(Mark ▼" should read -- (Mark ▲ --.

Column 10,
Line 38, "1000 sccm." should read -- 10000 sccm. --.

Signed and Sealed this

Nineteenth Day of April, 2005

JON W. DUDAS
*Director of the United States Patent and Trademark Office*